(12) United States Patent
Peng et al.

(10) Patent No.: US 6,677,785 B1
(45) Date of Patent: Jan. 13, 2004

(54) POWER LEVEL DETECTION CIRCUIT

(75) Inventors: Yung-Chow Peng, Hsinchu (TW);
Li-Yueh Wang, Tai-Ping (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 10/202,184

(22) Filed: Jul. 24, 2002

(51) Int. Cl.$^7$ .............................................. H03K 5/00
(52) U.S. Cl. .............................. 327/74; 327/75; 327/76
(58) Field of Search ............................ 327/77, 82, 88, 327/90, 93, 60, 78, 74, 75, 76; 365/185.18, 189.09

(56) References Cited

U.S. PATENT DOCUMENTS

| 5,945,920 | A | * | 8/1999 | Maletsky | ............... | 340/825.54 |
| 6,229,352 | B1 | | 5/2001 | Chevallier et al. | ............. | 327/77 |
| 6,469,936 | B2 | * | 10/2002 | Roohparvar | ........... | 365/185.18 |
| 6,519,191 | B1 | * | 2/2003 | Morishita | .............. | 365/189.09 |

* cited by examiner

Primary Examiner—Tuan T. Lam
Assistant Examiner—Hiep Nguyen
(74) Attorney, Agent, or Firm—Raymond Sun

(57) ABSTRACT

A power level detection circuit detects the voltage level of a power source. The power level detection circuit has a first voltage level detector having an input coupled to the power source and outputting a first signal representative of an upper boundary, a second voltage level detector having an input coupled to the power source and outputting a second signal representative of a desired detection level, and a third voltage level detector having an input coupled to the power source and outputting a third signal representative of a lower boundary. The power level detection circuit also has a control circuit coupled to the first, second and third signals for outputting a power level detection signal if there is a change in the second signal, and when the power level is greater than the level of the third signal and less than the level of the first signal.

8 Claims, 5 Drawing Sheets

POWER LEVEL DETECTION CIRCUIT

BACKGROUND OF THE INVENTION

1. Field of the Invention

The present invention relates to the field of level detection circuitry, and in particular, to a circuit for detecting the level of an input signal, such as a power supply signal.

2. Background Art

Power level detection circuits are commonly used to control power switching in a variety of operations, such as in multi-power systems or to initialize a system when a particular power level is detected.

Hysteresis is a well-known concept where there is positive transition (i.e., signal goes from low to high) at a higher detection level, and negative transition (i.e., signal goes from high to low) at a lower detection level. In other words, when the input signal goes from low to high, the detection level is higher than the detection level for detecting a signal that goes from high to low, and when the input signal goes from high to low, the detection level is lower than the detection level for detecting a signal that goes from low to high. Hysteresis circuits are typically used to ignore spike noises on the signal.

U.S. Pat. No. 6,229,352 illustrates a power level detection circuit that uses the hysteresis concept in its translator shown in FIG. 1. However, the power level detection circuit in U.S. Pat. No. 6,229,352 suffers from several drawbacks.

First, power detection levels are different for power up and for power down. This is seen from the fact that Vcc is the input, and the output 20 of the pulse shaper 18 is used to set the output of the translator 16. Thus, when the input signal goes from low to high, the detection level is higher than the detection level for detecting a signal that goes from high to low, and when the input signal goes from high to low, the detection level is lower than the detection level for detecting a signal that goes from low to high. As explained above, this behaviour is called hysteresis. This means that the detection level is different for positive transition and negative transition, which is undesirable because power conflict and excessive power consumption would result if this circuit were used to control power switching between two different power sources. Power conflicts occur when power switches from one source to another. If these two power sources have different voltage levels, then each of these two power sources will try to overcome the other over a short period of time when the switches between these two power sources are both turned on.

Second, noise immunity is dependent on the hysteresis level and this conflicts with the accuracy of the power detection. In other words, noise affects the accurate detection of the power level.

The recent trend in newer power supply and switching systems is to utilize lower power levels. However, setting the hysteresis level will be difficult. For example, setting higher hysteresis may induce power conflict issues, and setting lower hysteresis will provide little noise immunity. For lower power levels, designing a circuit with an appropriate hysteresis level will be difficult because design margin will be tight.

Thus, there still remains a need for a power level detection circuit that avoids the drawbacks set forth above.

SUMMARY OF THE INVENTION

It is an object of the present invention to provide a power level detection circuit where the switching level is set by a mid-level detector.

It is another object of the present invention to provide a power level detection circuit using the hysteresis concept where the hysteresis level is set by a high-level detector and a low-level detector.

It is yet another object of the present invention to provide a power level detection circuit that has a simple architecture.

To accomplish the objectives of the present invention, there is provided a power level detection circuit for detecting the voltage level of a power source. The power level detection circuit has a first voltage level detector having an input coupled to the power source and outputting a first signal representative of an upper boundary, a second voltage level detector having an input coupled to the power source and outputting a second signal representative of a desired detection level, and a third voltage level detector having an input coupled to the power source and outputting a third signal representative of a lower boundary. The power level detection circuit also has a control circuit coupled to the first, second and third signals for outputting a power level detection signal if there is a change in the second signal, and when the power level is greater than the level of the third signal and less than the level of the first signal.

BRIEF DESCRIPTION OF THE DRAWINGS

The invention can be more fully understood by reading the subsequent detailed description of the preferred embodiments, with reference made to the accompanying drawings.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

Figure 1:
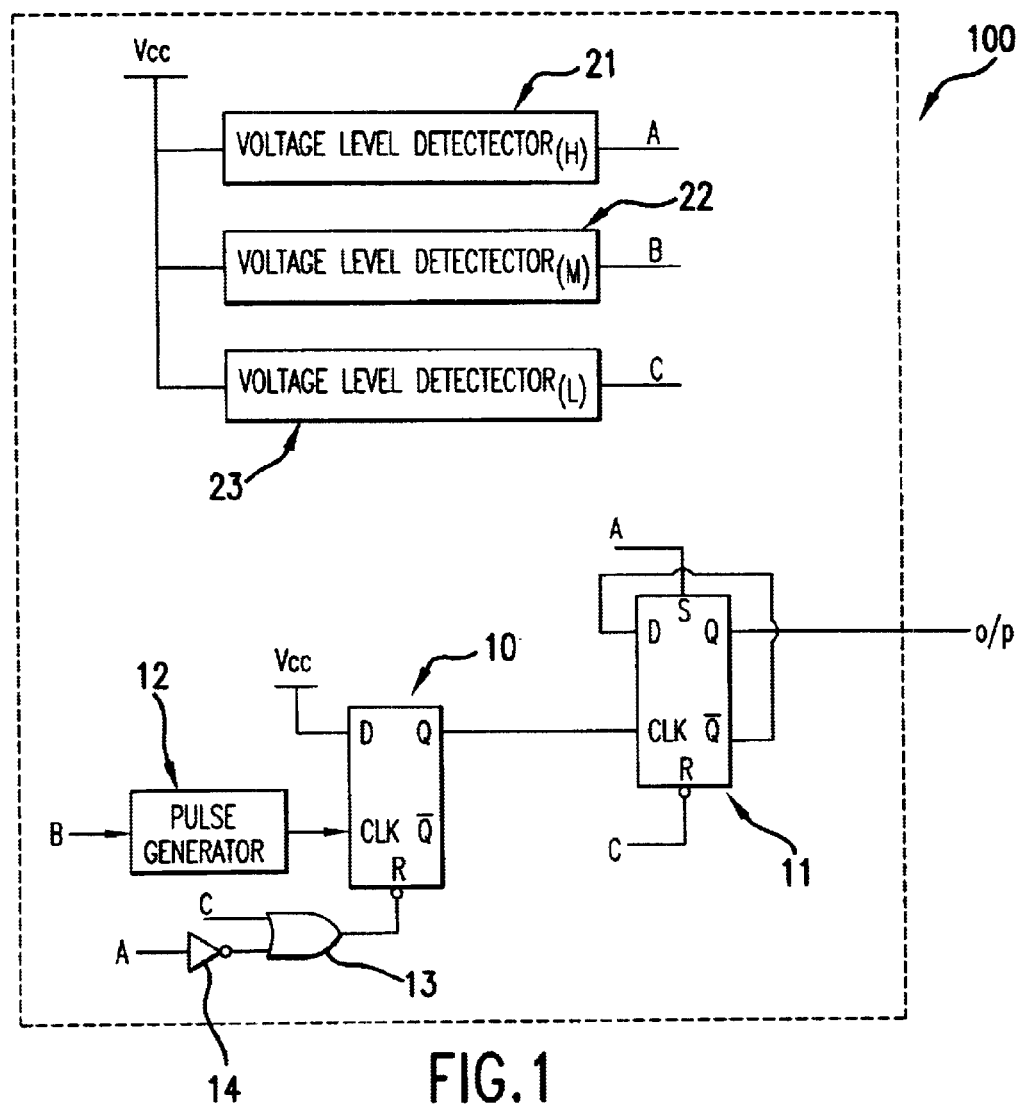
FIG. 1 is a schematic block diagram illustrating a power level detection circuit according to one embodiment of the present invention.

FIG. 1 illustrates a power level detection circuit 100 according to one embodiment of the present invention. The power level detection circuit 100 has a high power level detector 21, a medium power level detector 22 and a low power level detector 23, each of which receives a voltage input from the power source Vcc. Each detector 21, 22, 23 is set to detect for a given reference voltage. The medium power level detector 22 is used to detect the desired power level. The high power level detector 21 and the low power level detector 23 are set to detect for a high voltage level and a low voltage level, respectively, and are therefore used to set the upper and lower boundaries, respectively, for anticipated noise, so as to minimize any effect that noise might have on the detection of the desired power level. The detectors 21, 22 and 23 output three separate digital signals A, B and C, respectively, each of which is a voltage level.

Figure 2:
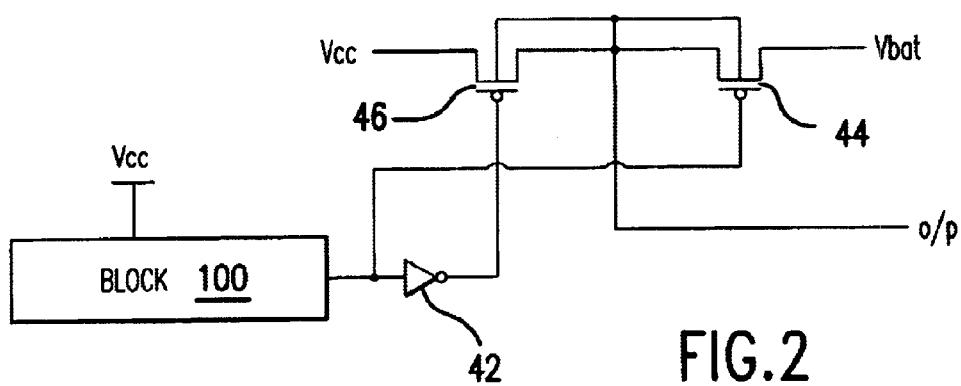
FIG. 2 illustrates the implementation of the circuit of FIG. 1 in a multi-power system.

The power level detection circuit 100 also includes a pulse generator 12 that receives the input B from the medium power level detector 22. The signal B changes from low to high when the power level passes from low to high through the middle reference level. The signal B changes from high to low when the power level passes from high to low through the middle reference level. The pulse generator 12 functions to transfer the level change signal to a pulse change signal. In other words, pulse generator 12 generates a pulse output if the signal B changes from high to low, or from low to high. The power level detection circuit 100 further includes a first flip flop 10 having its clock input coupled to the output of the pulse generator 12, a D-input coupled to Vcc, and its R input coupled to the output of an OR gate 13. The OR gate 13 has two inputs, one input coupled to the signal C from the low power level voltage detector 23, and another input coupled to the output of an inverter 14. The input of the inverter is coupled to the signal A from the high power level voltage detector 21. The power level detection circuit 100 further includes a second flip flop 11 having its clock input coupled to the Q output of the first flip flop 10, a D-input coupled to the Q' output of the second flip flop 11, an S-input coupled to the signal A from the high power level voltage detector 21, and an R input coupled to the signal C from the low power level voltage detector 23. The Q-output of the second flip flop 11 is the output of the circuit 100, and is typically used as a system reset control or power control switch. FIG. 2 illustrates the coupling of this output signal to the input of a power switch control circuit.

The first flip flop 10 is used to generate a one-shot level change from low to high to trigger the second flip flop 11. The first flip flop 10 can generate a new level change only after A or C are toggled to reset the first flip flop 10, as explained below. Thus, the first flip flop 10 will only output a one-shot level change no matter how many times signal B may have changed. This operates to reduce the interference on signal B.

The detection function of the second flip flop 11 is enabled only when the power level is lower than the high detection level (i.e., lower than A) and is higher than the low detection level (i.e., higher than C). When the power level is higher than the high detection level, the output (o/p) of the second flip flop 11 will be set as high. When the power level is lower than the low detection level, the output (o/p) of the second flip flop 11 will be reset as low.

Thus, the first flip flop 10 records that the power level has crossed the middle detection level (i.e., B), and the second flip flop 11 records the signal change direction of the signal B (i.e., from high to low, or low to high).

The logic of the circuit 100 will provide the following results. If the signal B does not change, then the pulse generator 12 will not provide a pulse signal to drive the clock of the first flip flop 10, which in turn means that the first flip flop 10 will not drive the clock of the second flip flop 11, so that the output (o/p) of the second flip flop 11 does not change.

On the other hand, if the signal B changes, then the pulse generator 12 will provide a pulse signal to the clock of the first flip flop 10, causing the first flip flop 10 to generate a one-shot clock from low to high, and one of the following events will also occur:

(1) First, the flip flops 10 and 11 are normally reset by negative signals. Thus, if the power level of the power source Vcc is lower than a predetermined low level (i.e., lower than C), all of signals A, B and C will output a "low" signal. The "low" C signal will reset the second flip flop 11 to initialize the output of the circuit 100, so that the output signal (o/p) of the second flip flop 11 is zero or "low". In addition, the logic associated with the OR gate 13 means that a "low" C signal or a "high" A signal will also reset the first flip flop 10.

(2) If the power level of the power source Vcc is higher than a predetermined high level (i.e., higher than A), all of signals A, B and C will output a "high" signal. The "high" A signal will set the output of the second flip flop 11 to the existing voltage level of Vcc (i.e., a "high" signal).

Thus, the reset "low" (situation #1 above) and the set "high" (situation #2 above) signals are used to initialize the second flip flop 11 when the power level is either lower than a predetermined low level, or higher than a predetermined high level. In other words, if the power level is outside the range defined by the levels A and C, then the second flip flop 11 is either set or reset.

(3) If the power level of the power source Vcc is not higher than a predetermined high level (i.e., not greater than A), and not lower than a predetermined low level (i.e., not less than C) (hereinafter referred to as "the middle region"), then the signal A will be "low" and the signal C will be "high". With this logic, the flip flops 10 and 11 will neither be set nor reset, and the power level can be monitored until it passes or crosses the middle detection level. The second flip flop 11 will then be toggled by the output of the first flip flop 10 when the power level crosses the middle detection level, which causes the signal B to change. In other words, when the power level is in the middle region, the signal B will change when the power level passes through the middle detection level (i.e., B). The pulse generator 12 will transfer its input, which is a level change signal B, to an output that is a pulse change signal (i.e., the output of the second flip flop 10). The first flip flop 10 will only sense the first time a level change occurs within the middle region. When the power level is outside the middle region (i.e., the power level is less than C or greater than A), the first flip flop 10 will be reset to wait for the next time the power level actually moves into the middle region and crosses the middle detection level.

Thus, the high power level detector 21 and the low power level detector 23 are used to set the upper and lower boundaries, respectively, for anticipated noise, so as to minimize any effect that noise might have on the detection of the desired power level. The high hysteresis level is set as the difference between the voltage level of the detectors 22 and 23, and the low hysteresis level is set as the difference between the voltage level of the detectors 22 and 21.

FIG. 2 illustrates the implementation of the power level detection circuit 100 of FIG. 1 in a multi-power system. In FIG. 2, the output signal (o/p) is used to switch the power source between Vcc and a battery Vbat. The output signal (o/p) is coupled to both an input of an inverter 42 and a gate node of a first transistor 44 (which can be a PMOS). The output of the inverter 42 is coupled to a gate node of a second transistor 46 (which can be a PMOS). The drain node of the first transistor 44 is coupled to Vbat, and the source node of the first transistor 44 is coupled to the source node of the second transistor 46. The drain node of the second transistor 46 is coupled to Vcc. The source nodes of the first and second transistors 44 and 46 provide the output (o/p). In operation, if the output of circuit 100 is a "high" signal, this "high" signal will not turn on the first transistor 44, and the second transistor 46 will turn on, so that the voltage from Vcc is output as the output signal (o/p). Conversely, if the output of circuit 100 is a "low" signal, this "low" signal will not turn on the second transistor 46, and the first transistor 44 will turn on, so that the voltage from Vbat is output as the output signal (o/p).

Figure 3:
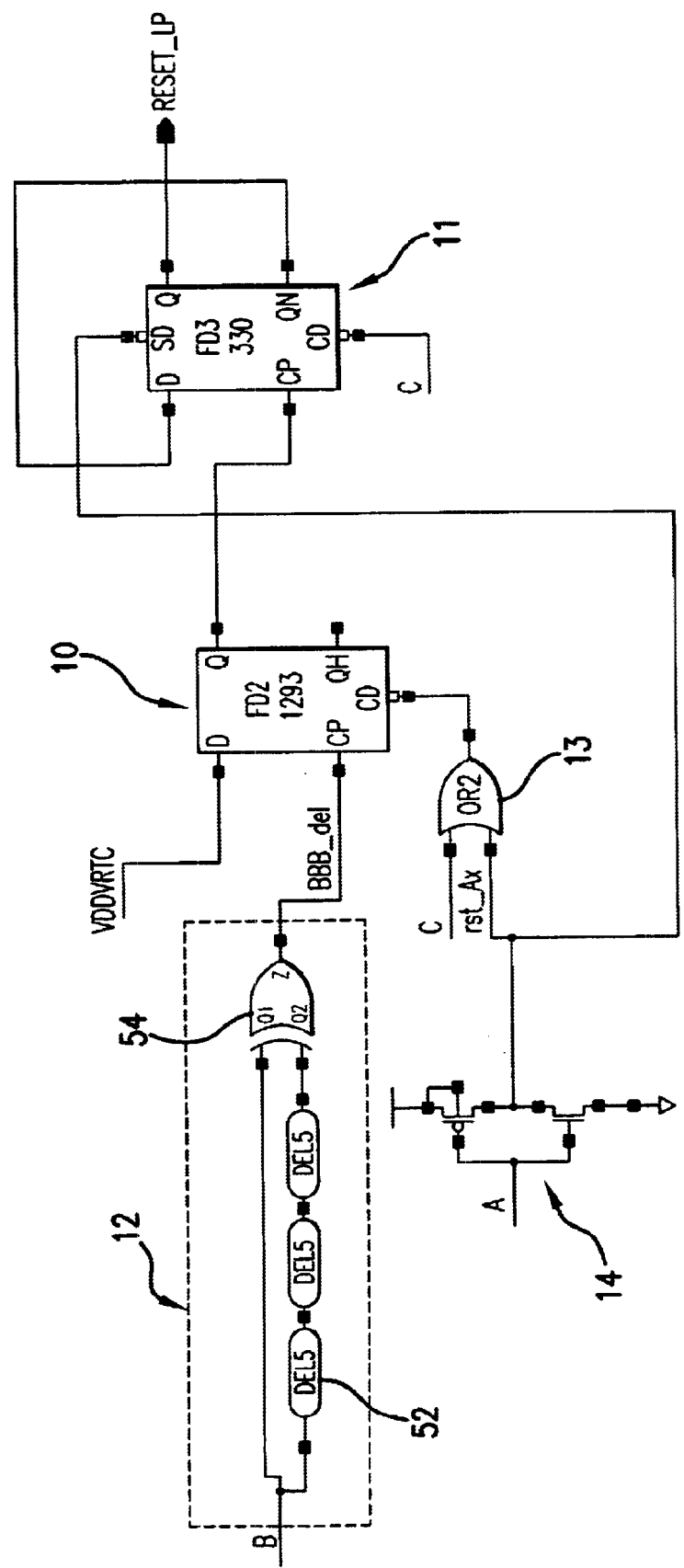
FIG. 3 is a circuit diagram illustrating in greater detail a portion of the circuit of FIG. 1.

FIG. 3 is a circuit diagram illustrating in greater detail a portion of the circuit 100 of FIG. 1. As shown in FIG. 3, the pulse generator 12 can be provided in the form of a plurality of delay cells 52 that are arranged in series, and coupled to an input of an XOR gate 54. The other input of the XOR gate 54 is coupled to the signal B.

Figure 4:
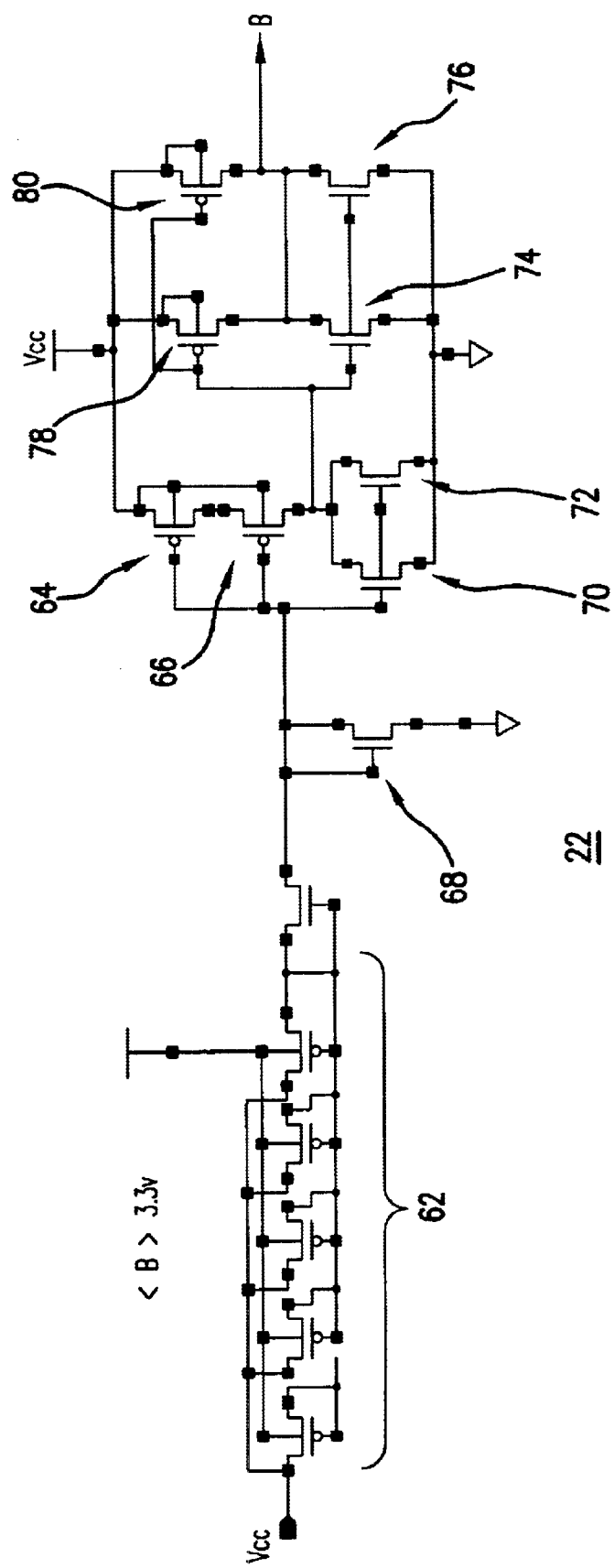
FIG. 4 is a circuit diagram of one of the voltage level detectors in FIG. 1.

FIG. 4 is a circuit diagram of the voltage level detector 22 in FIG. 1. The detector 22 has an input that receives the power level signal from Vcc, which is coupled to a plurality of transistors 62 that are connected in series. The plurality of transistors 62 and the NMOS 68 are used as a resistor string, so that the drain node of NMOS 68 outputs the ratio of the input signal Vcc. PMOS 64, PMOS 66, NMOS 70 and NMOS 72 are used together as an inverter having a transition level that is defined by the size ratio between the NMOS 70 and 72 and the PMOS 64 and 66. It is this transition level that defines the desired reference voltage for the detector 22. Thus, a simple detection circuit can be made by combining these two circuits (i.e., the resistor string and the inverter). This means that if the output signal from the drain node of the NMOS 68 is higher than the transition level of the inverter (i.e., PMOS 64, PMOS 66, NMOS 70 and NMOS 72), then the detector 22 outputs a "high" signal, and if the output signal from the drain node of the NMOS 68 is lower than the transition level of the inverter (i.e., PMOS 64, PMOS 66, NMOS 70 and NMOS 72), then the detector 22 outputs a "low" signal. PMOS 78, PMOS 80, NMOS 74 and NMOS 76 are also used together as an inverter, The pairs of MOS 70+72, 74+76 and 78+80 are tied together respectively.

The other detectors 21 and 23 can have the same configuration as the detector 22, except that the transistors (e.g., 62, 68, 64, 66, 70, 72, 74, 76, 78 and 80) can be provided with different sizes to lead to different threshold voltages, so as to obtain different reference voltages.

Figure 5A:
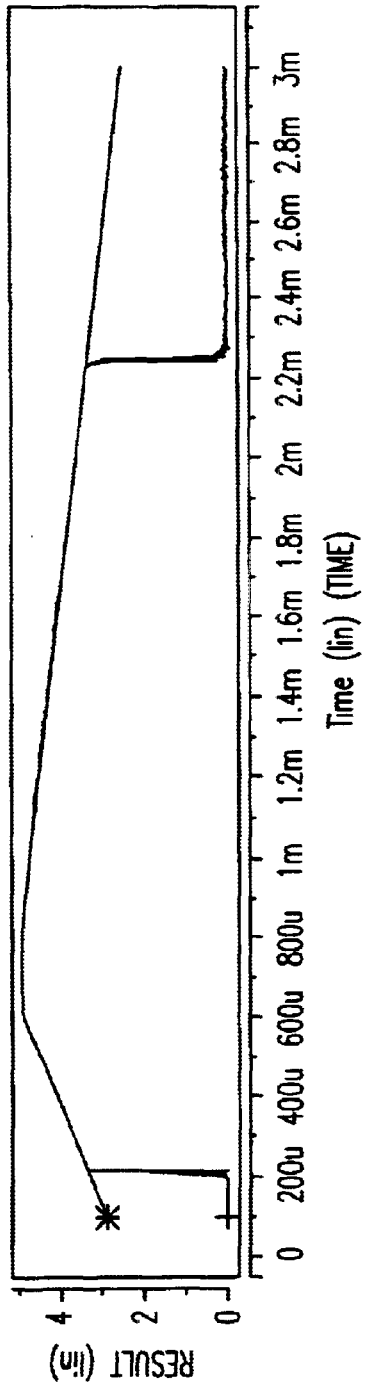
FIGS. 5A–5D are graphical illustrations of the performance of the circuit of FIG. 1 as compared with conventional circuits.
Figure 5B:
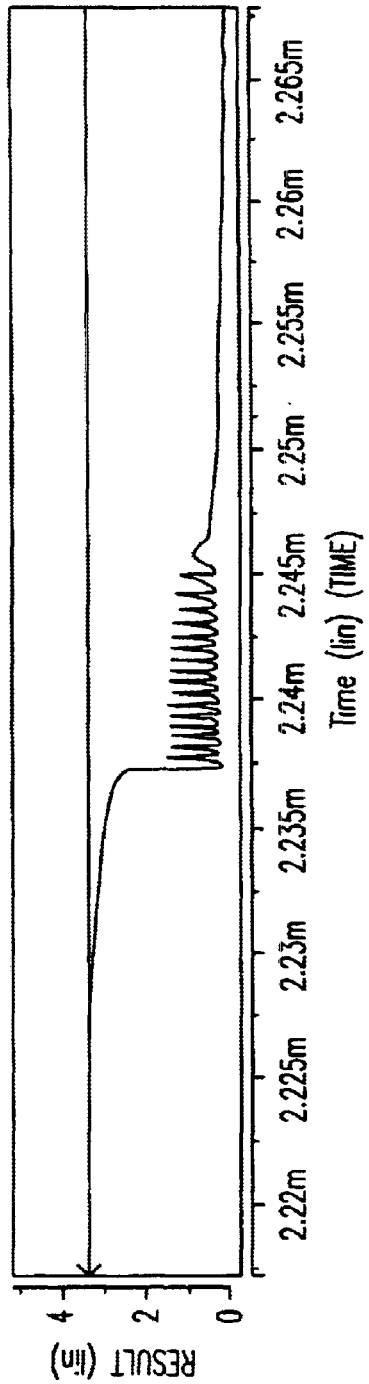
Figure 5C:
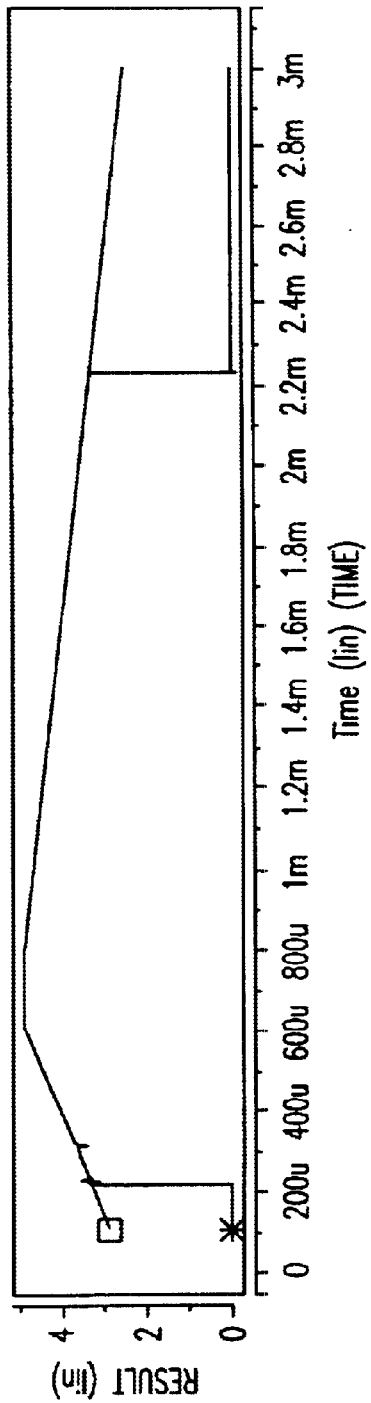
Figure 5D:
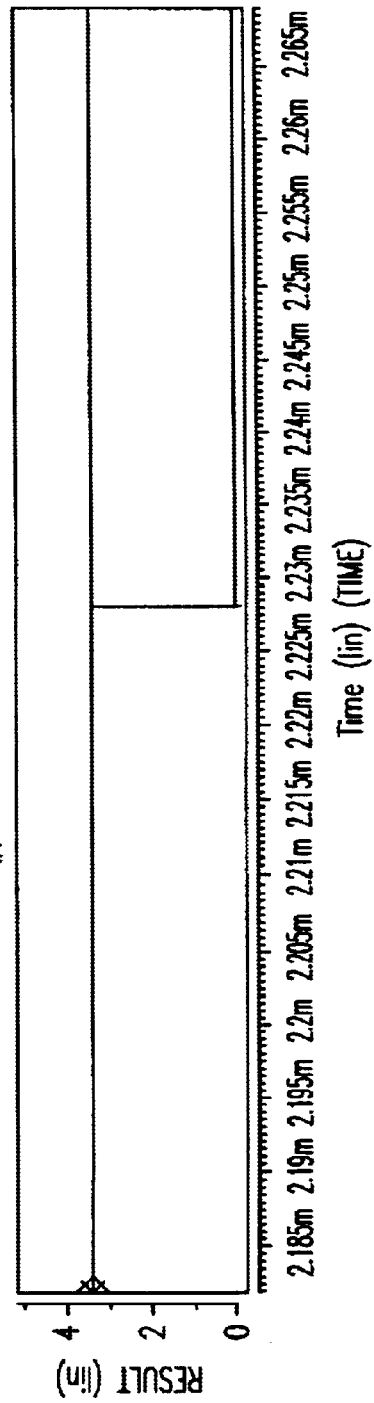

FIGS. 5A and 5B illustrate the operation of a conventional power level detection circuit. FIG. 5A shows the relationship between the input Vcc and the output for a conventional power level detection circuit. FIG. 5B is a zoom-in of FIG. 5A at the location where a transition occurred, illustrating that there are many spikes (caused by undesirable noise) on the output signal after the transition is detected. On the other hand, FIGS. 5C and 5D illustrate the operation of the power level detection circuit 100. FIG. 5C shows the relationship between the input Vcc and the output (o/p) for the power level detection circuit 100 of the present invention. FIG. 5D is a zoom-in of FIG. 5C at the location where a transition occurred, illustrating that there is only a one-shot trigger (i.e., no spikes) after the transition is detected.

The power level detection circuit 100 of the present invention provides a number of benefits. First, the circuit 100 provides for detection at one power level, thereby minimizing the undesirable power conflict and excessive power consumption experienced by circuits that have different detection levels for positive transition and negative transition. Second, the circuit 100 defines separate independent hysteresis levels, so that it is better able to minimize any effect that noise might have on the detection of the desired power level.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A power level detection circuit for detecting the voltage level of a power source, comprising:

a first voltage level detector having an input coupled to the power source and outputting a first signal representative of an upper boundary voltage level;

a second voltage level detector having an input coupled to the power source and outputting a second signal representative of a desired detection level;

a third voltage level detector having an input coupled to the power source and outputting a third signal representative of a lower boundary voltage level; and means coupled to the first, second and third signals for outputting a power level detection signal when there is a change in the second signal, and when the power level is greater than the lower boundary voltage level and less than the upper boundary voltage level;

wherein the second voltage level detector has a single-input comparator.

2. The circuit of claim 1, wherein the outputting means further includes means for recording that the power level has crossed the desired detection level, and means for recording the signal change direction of the second signal.

3. The circuit of claim 1, wherein the first voltage level detector and the third voltage level detector define separate hysteresis levels.

4. A power level detection circuit for detecting the voltage level of a power source, comprising:

a first voltage level detector having an input coupled to the power source and outputting a first signal representative of an upper boundary;

a second voltage level detector having an input coupled to the power source and outputting a second signal representative of a desired detection level;

a third voltage level detector having an input coupled to the power source and outputting a third signal representative of a lower boundary;

a pulse generator having an input coupled to receive the second signal, and having a pulsed output;

a first flip flop having an input that receives the output of the pulse generator, the first flip flop generating a one-time level change signal when the first flip flop receives a pulsed output from the pulse generator; and a second flip flop having a clock input that receives the one-time level change signal from the first flip flop, the second flip flop generating a power level detection signal when the second flip flop receives the one-time level change signal from the first flip flop.

5. The circuit of claim 4, wherein the first flip flop generates the one-time level change signal when the power level is greater than the lower boundary and less than the upper boundary.

6. The circuit of claim 4, wherein the second flip flop further includes inputs for receiving the first and third signals, and wherein the second flip flop generates the power level detection signal when the power level is greater than the lower boundary and less than the upper boundary.

7. A method of detecting the voltage level of a power source, comprising:

providing a power level from a power source;

setting an upper voltage boundary;

setting a lower voltage boundary;

setting a middle detection level;

generating a detection signal having a one-time level change, which indicates the first time that the power level crosses the middle detection level when the power level is greater than the lower voltage boundary and less than the upper voltage boundary.

8. The method of claim 7, wherein the step of generating a detection signal further includes:

detecting the direction of change in the detection signal when the power level is greater than the lower voltage boundary and less than the upper voltage boundary.

* * * * *